(12) United States Patent
Xu et al.

(10) Patent No.: US 10,777,514 B2
(45) Date of Patent: Sep. 15, 2020

(54) TECHNIQUES FOR AN INDUCTOR AT A SECOND LEVEL INTERFACE

(71) Applicant: Intel Corporation, Santa Clara, CA (US)

(72) Inventors: Cheng Xu, Chandler, AZ (US); Yikang Deng, Chandler, AZ (US); Kyu Oh Lee, Chandler, AZ (US); Ji Yong Park, Chandler, AZ (US); Srinivas Pietambaram, Gilbert, AZ (US); Ying Wang, Chandler, AZ (US); Chong Zhang, Chandler, AZ (US); Rui Zhang, Cupertino, CA (US); Junnan Zhao, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 16/012,371

(22) Filed: Jun. 19, 2018

(65) Prior Publication Data

US 2019/0385959 A1    Dec. 19, 2019

(51) Int. Cl.
*H01L 23/64* (2006.01)
*H01L 23/522* (2006.01)
*H01L 23/528* (2006.01)
*H01F 27/24* (2006.01)
*H01L 27/04* (2006.01)
*H01F 27/28* (2006.01)
*H01L 21/822* (2006.01)

(52) U.S. Cl.
CPC .......... *H01L 23/645* (2013.01); *H01F 27/24* (2013.01); *H01F 27/2804* (2013.01); *H01L 21/822* (2013.01); *H01L 23/528* (2013.01); *H01L 23/5227* (2013.01); *H01L 27/04* (2013.01)

(58) Field of Classification Search
CPC ......... H01L 23/49816; H01L 23/49827; H01L 23/645; H01L 24/16; H01L 24/48; H01L 24/97
See application file for complete search history.

(56) References Cited

U.S. PATENT DOCUMENTS

| | | | |
|---|---|---|---|
| 2012/0212919 A1* | 8/2012 | Mano | H05K 1/185 361/782 |
| 2014/0034373 A1* | 2/2014 | Yoshikawa | H01F 5/003 174/260 |
| 2015/0115405 A1* | 4/2015 | Wu | H01L 28/10 257/531 |
| 2016/0013160 A1* | 1/2016 | Chun | H01L 23/3192 257/751 |
| 2017/0062120 A1* | 3/2017 | Yun | H01F 17/0013 |

(Continued)

*Primary Examiner* — Zandra V Smith
*Assistant Examiner* — John M Parker
(74) *Attorney, Agent, or Firm* — Schwegman Lundberg & Woessner, P.A.

(57) ABSTRACT

Techniques are provided for an inductor at a second level interface between a first substrate and a second substrate. In an example, the inductor can include a winding and a core disposed inside the winding. The winding can include first conductive traces of a first substrate, second conductive traces of a second non-semiconductor substrate, and a plurality of connectors configured to connect the first substrate with the second substrate. Each connector of the plurality of connectors can be located between a trace of the first conductive traces and a corresponding trace of the second conductive traces.

16 Claims, 5 Drawing Sheets

(56) References Cited

U.S. PATENT DOCUMENTS

| | | | |
|---|---|---|---|
| 2017/0140862 A1* | 5/2017 | Yun | H01F 10/12 |
| 2017/0271260 A1* | 9/2017 | Wojnowski | H01L 23/5226 |
| 2019/0206780 A1* | 7/2019 | Chatterjee | H01F 27/2804 |
| 2019/0272936 A1* | 9/2019 | Zhang | H01F 41/0206 |
| 2019/0274217 A1* | 9/2019 | Zhang | H01F 41/041 |
| 2019/0279806 A1* | 9/2019 | Darmawikarta | H01F 17/0006 |
| 2019/0348389 A1* | 11/2019 | Pancholi | H01L 24/11 |
| 2019/0385780 A1* | 12/2019 | Xu | H01L 28/10 |
| 2020/0006239 A1* | 1/2020 | Zhang | H01L 51/0004 |

* cited by examiner

TECHNIQUES FOR AN INDUCTOR AT A SECOND LEVEL INTERFACE

TECHNICAL FIELD

This document pertains generally, but not by way of limitation, to inductors, and more particularly, to an inductor formed at a second level interface of an electronic circuit package.

BACKGROUND

Electronic circuit evolution continues to provide ever increasing functionality and speed from ever smaller systems. Such miniaturization pressures circuit designers to use less components, in smaller sizes, yet deliver the same or improved performance. Inductors have also been relegated to the same design constraints. However, in certain terms, better inductor characteristics typically require increase size in at least one dimension.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The present inventors have recognized alternative techniques that can provide an inductor with increased z-axis form factor yet not increase the form factor of stacked circuits connected at a second level interface. As used herein, a second level interface is an electrical and mechanical connection between a first circuit substrate and a second non-semiconductor substrate such as a printed circuit board. It is anticipated that future electronic devices may require significant power delivery improvements without increasing in size, especially in vertical height which may be referred to as a z-axis dimension or z-height. Magnetic inductor arrays can provide some improvement, but also require an external device that, in most cases, add to or will not satisfy future z-height requirements. Enabling magnetic materials on a coreless substrate may satisfy both future z-height requirements and performance, however, processes used to embed the magnetic components interact with wet chemistry processes such as, but not limited to, desmear, eless Cu, flash etch, soft etch, or surface finish. Magnetic materials can exposed to the chemistry baths during processing and can result in premature corrosion, as well as, leaching of the magnetic materials into the baths. Such leaching can corrupt the bath resulting in shorter bath life and diminished chemistry performance, thus, adding additional costs to processing.

Figure 1A:
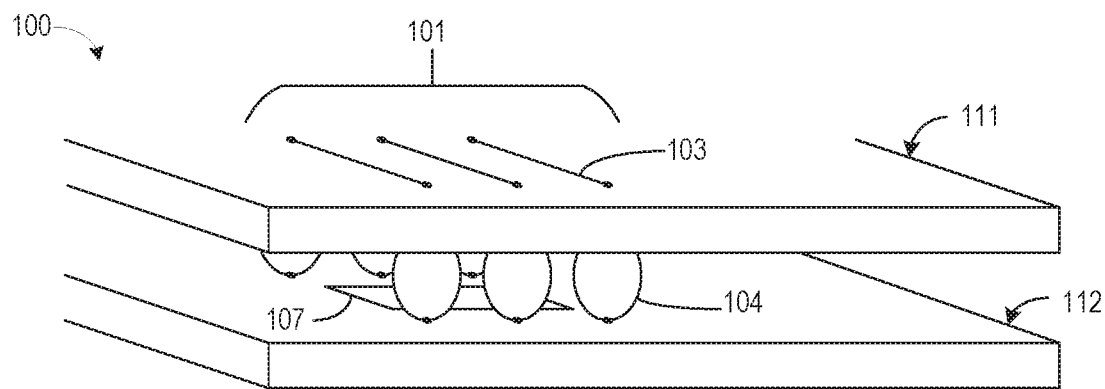
FIGS. 1A-1C illustrate generally a perspective view of circuit package including an inductor formed at a second level interface according to various examples of the present subject matter.
Figure 1B:
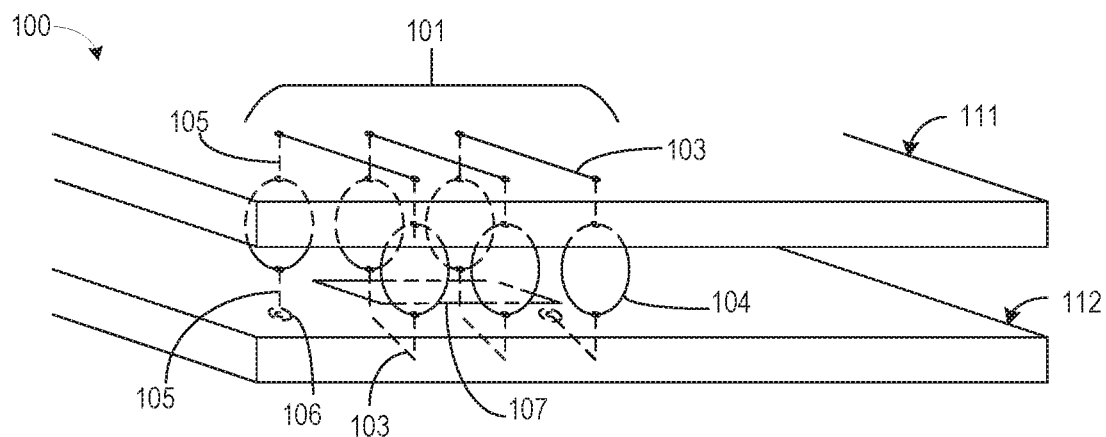
Figure 1C:
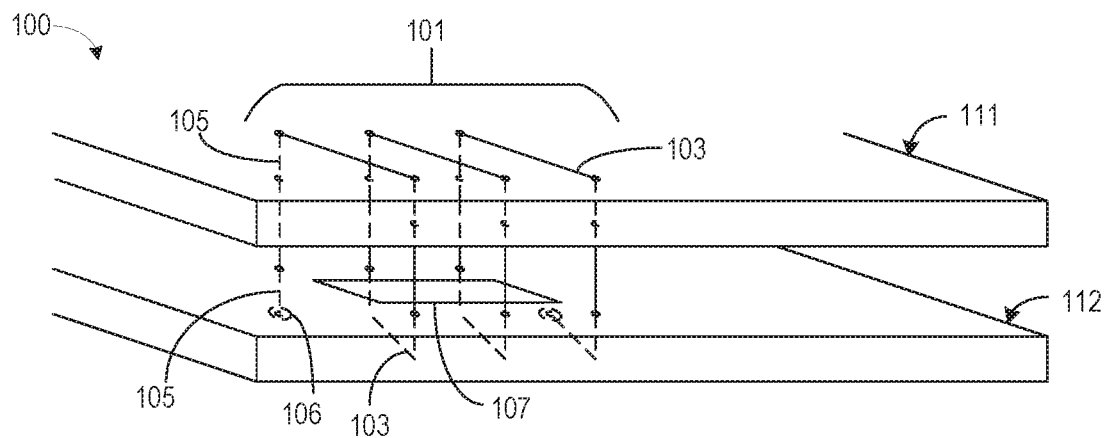

FIGS. 1A-1C illustrate generally a perspective view of electronic package 100 including an inductor 101 formed at a second level interface according to various examples of the present subject matter. The electronic package 100 can include a first substrate 111, a second substrate 112, and interconnects 102 of the second level interface for electrically and mechanically connecting the first substrate 111 with the second substrate 112. In certain examples, the first substrate can be a die, a substrate of integrated circuit package that includes external connections of the integrated circuit package, or other substrate. In certain examples, the second substrate can be a non-semiconductor substrate, such as a printed circuit board, a non-semiconductor, or organic, interposer package, a portion of a package-to-package interface of a package-on-package (POP) device, or combinations thereof. Each of the first substrate 111 and the second substrate 112 can include traces 103 embedded within, or located on a surface of the respective substrate 111, 112. Each trace 103 can form a portion of an inductor coil. Upon connection of the first substrate 111 with the second substrate 112, the respective traces 103 can from one or more coil loops of the inductor 101. In certain examples, the inductor 101 does not include a magnetic core. In other examples, a magnetic material 107 can be applied to an external side of either the first substrate 111, the second substrate 112, or a combination of the first substrate 111 and the second substrate 112 to provide a magnetic core inductor. FIG. 1A illustrates generally a perspective view of an example inductor 101 formed at a second level interface. FIG. 1B illustrates generally the example of FIG. 1A with dashed lines to show hidden features of the assembled first and second substrates 111, 112. FIG. 1C illustrates generally the examples of FIGS. 1A and 1B with the solder ball interconnects 104 drawn as lines. FIG. 1C more clearly illustrates the multiple coils formed when the first substrate 111 and the second strate 112 are electrically connected.

Each of the first substrate 111 and the second substrate 112 can include traces 103 that form the inductor 101 when the substrates 111, 112 are electrically connected together. The example of FIGS. 1A-1C show the traces 103 on or at a surface of each respective substrate 111, 112 that faces away from the center of the inductor 103. Conductive throughsilicon-vias (TSVs), or conductive vias 105 extending through the particular substrate 111, 112, can couple a trace 103 to a respective interconnect 104 or to an interconnect pad 106 used to electrically couple the first and second substrates 111, 112 together. In other examples, the traces 103 of each substrate can optionally be at or near the opposite surface of the respective substrate 111, 112, for example, the surface of the substrate facing toward the center of the inductor 101 and including the termination for the corresponding interconnect 104. In certain examples, such as that shown in FIGS. 1A and 1B, the interconnects 104 between the first substrate 111 and the second substrate 112 can include solder balls. It is understood that other interconnects besides solder balls or bumps can be used without departing from the present subject matter, including, but not limited to, connection pins, microballs (μballs), alloy paste, Cn/Sn bumps, or other suitable interconnect structure for a second level interface.

Figure 2A:
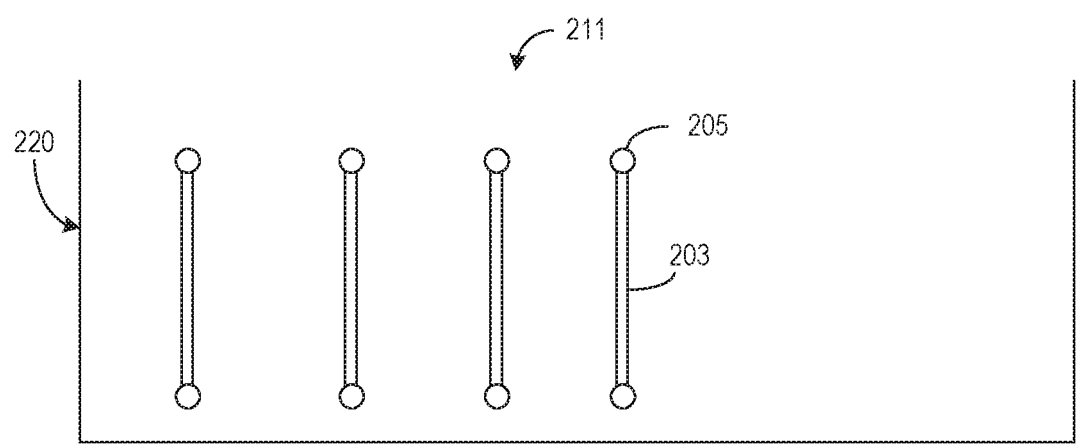
FIG. 2A illustrates generally top or bottom view of a first circuit configured to form an inductor at a second level interface.

FIG. 2A illustrates generally top or bottom view of a first substrate 211 configured to form an inductor at a second level interface. The first substrate 211 can include an integrated circuit, and one or more traces 203 configured to form a portion of each coil of the inductor. In some examples, the traces 203 can be form on a surface of the first substrate 211. In some examples, the traces 203 can be integrated with the first substrate 211. In certain examples, the first substrate 211 can optionally include vias 205 to connect a trace embedded within the substrate 211, or on a first surface of the first substrate 211, with a termination on a second surface of the first substrate 211. In certain examples, two or more external terminations of the first substrate 211 can connect with external terminations of a second substrate 212. In certain examples, the first substrate 211 can optionally include one or more terminations or one or more traces that couple the inductor to circuitry on the first substrate 211.

Figure 2B:
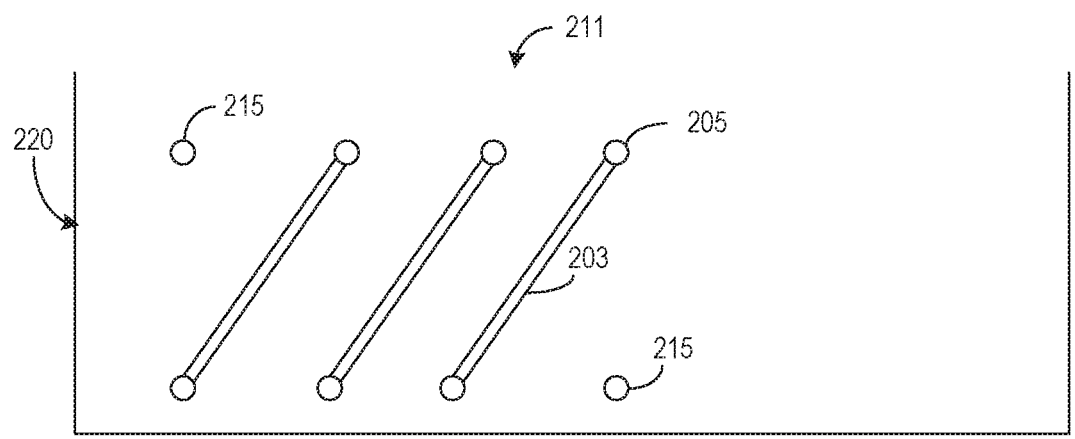
FIG. 2B illustrates generally top or bottom view of a second circuit or circuit board configured to form an inductor at a second level interface when electrically and mechanically coupled with the first circuit of FIG. 2A.

FIG. 2B illustrates generally top or bottom view of a second substrate 212 configured to form an inductor at a second level interface when electrically and mechanically coupled with the first substrate 211 of FIG. 2A. The second substrate 212 can include a non-semiconductor substrate, such as a printed circuit board, and one or more traces 203 configured to form a portion of each coil of the inductor. In some examples, the traces 203 can be located on a surface of the second substrate 212. In some examples, the traces 203 can be integrated with the second substrate 212. In certain examples, the second substrate 212 can include vias 205 to connect a trace embedded within the substrate 212, or on a first surface of the second substrate 212, with a termination on a second surface of the second substrate 212. In certain examples, two or more external terminations of the second substrate 212 can connect with external terminations of the first substrate 211 to form one or more coils of the inductor. In certain examples, the second substrate 212 can optionally include one or more terminations 215 or one or more traces that couple the inductor to circuitry of, or connected to, the second substrate 212.

In certain examples, the surface of one of the substrates that faces the inside of the inductor coils can include a magnetic material such that the inductor includes a magnetic core. The magnetic material can be assembled to the surface the substrate after most, if not all, of the chemical processing of any semiconductor substrate has been completed. As such, the magnetic material is not exposed to processing materials that can accelerate corrosion, and chemical baths used to process a semiconductor substrate are not exposed to contamination from the magnetic material.

Figure 3:
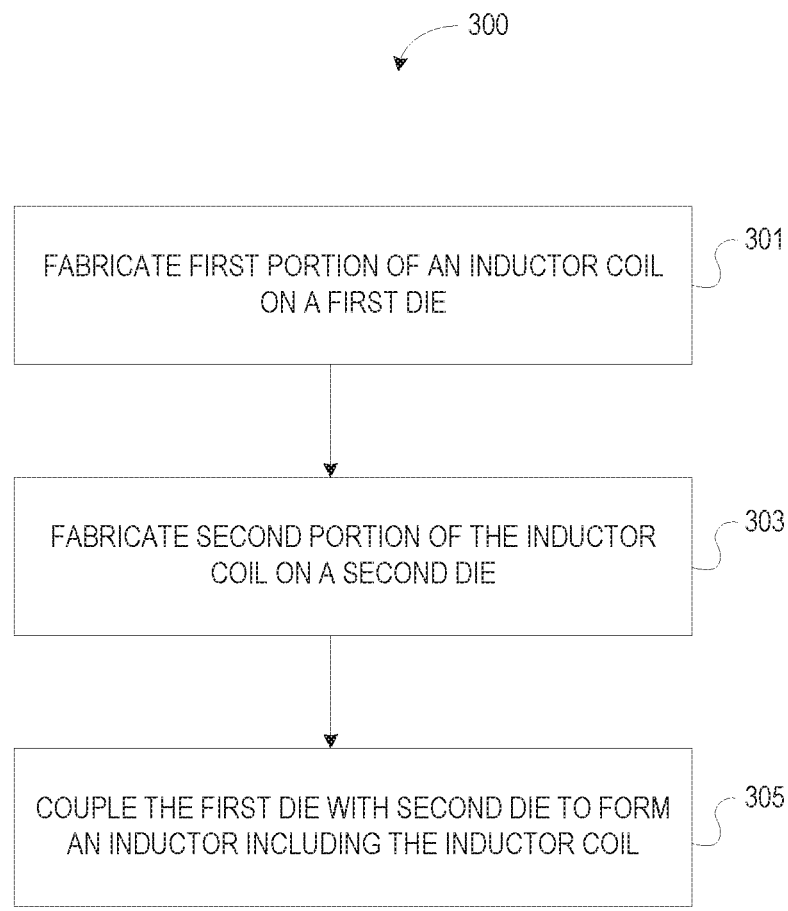
FIG. 3 illustrates generally a flowchart of an example method for manufacturing an inductor at a second level interface that does not increase the z-height of the circuit package.

FIG. 3 illustrates generally a flowchart of an example method 300 for manufacturing an inductor at a second level interface that does not increase the z-height of a stacked electronic package. At 301, a first portion of an inductor coil can be fabricated at or on a first substrate. In certain examples, the first portion can include a conductive trace deposited on, grown on, or embedded within the first substrate. In some examples, the first portion can include conductive vias to extend the trace to an external or internal termination of the first substrate.

At 303, a second portion of the inductor coil can be fabricated at or on a second non-semiconductor substrate. In certain examples, the second portion can include a conductive trace deposited on, grown on, or embedded within the second substrate. In some examples, the second portion can include conductive vias to extend the trace to an external or internal termination of the second substrate.

At 305, the first substrate can be electrically and mechanically coupled with the second substrate and can include electrically and mechanically coupling the first portion of the inductor coil with the second portion of the inductor coil to provide an inductor having at least one conductive coil or turn. In certain examples, the first portion of inductor coil can be electrically connected with the second portion of the inductor coil using interconnects such as solder balls or pins. In such cases, the interconnects can become part of the inductor and can form a portion of an inductor coil.

In some examples, a core material of the inductor can be fabricated on at least one of the first substrate or the second substrate such that the core material traverses through a coil of the inductor formed by the first portion, the second portion and the interconnects. In some examples, the core material can include a magnetic material, such as, but not limited to, a ferrous material, organic magnetic materials, inorganic magnetic materials, composite magnetic materials, or combination thereof. In certain examples, the core material can be applied using sputtering, spin coating, lamination, paste printing, or combinations thereof. In certain examples, the magnetic material can be applied by, but not limited to, chemical vapor deposition or sputtering. Such processes can allow use of insulating magnetic materials with higher permeability (1400-2400) including, but not limited to, FeXN, where Fe is iron, N is nitrogen and X can be Titanium (Ti), Aluminum (Al), Hafnium (Hf), Cobalt-Halfnium (CoHf), Chromium-Halfnium (CrHf).

Figure 4:
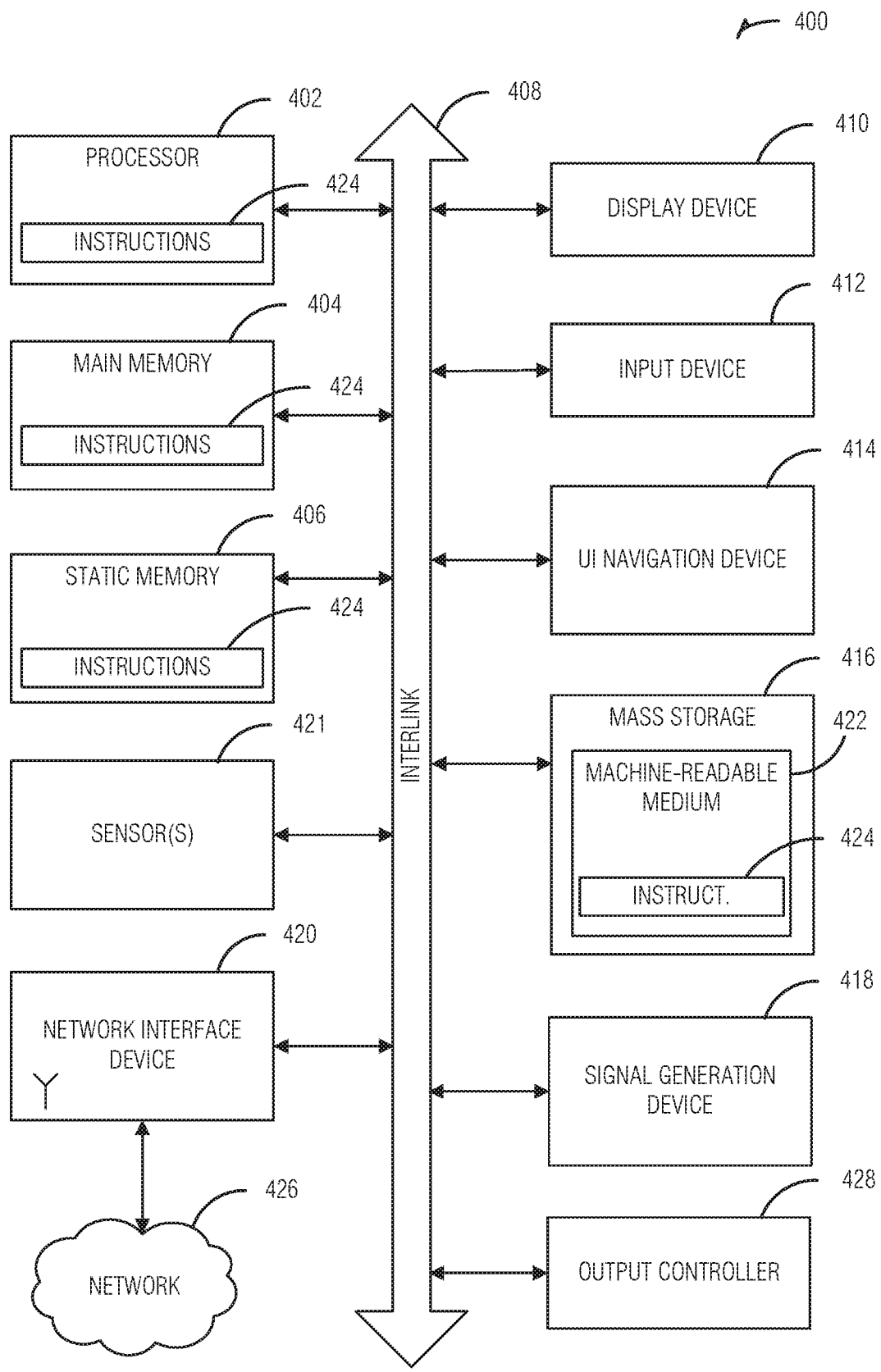
FIG. 4 illustrates a block diagram of an example machine upon which any one or more of the techniques (e.g., methodologies) discussed herein may perform. In alternative embodiments, the machine may operate as a standalone device or may be connected (e.g., networked) to other machines.

FIG. 4 illustrates a block diagram of an example machine 400 upon which any one or more of the techniques (e.g., methodologies) discussed herein may perform. In alternative embodiments, the machine 400 may operate as a standalone device or may be connected (e.g., networked) to other machines. In a networked deployment, the machine 400 may operate in the capacity of a server machine, a client machine, or both in server-client network environments. In an example, the machine 400 may act as a peer machine in peer-to-peer (or other distributed) network environment. As used herein, peer-to-peer refers to a data link directly between two devices (e.g., it is not a hub-and spoke topology). Accordingly, peer-to-peer networking is networking to a set of machines using peer-to-peer data links. The machine 400 may be a single-board computer, an integrated circuit package, a system-on-a-chip (SOC), a personal computer (PC), a tablet PC, a set-top box (STB), a personal digital assistant (PDA), a mobile telephone, a web appliance, a network router, or other machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc., to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

Machine (e.g., computer system) 400 may include a hardware processor 402 (e.g., a central processing unit (CPU), a graphics processing unit (GPU), a hardware processor core, or any combination thereof), a main memory 404 and a static memory 406, some or all of which may communicate with each other via an interlink (e.g., bus) 408. The machine 400 may further include a display unit 410, an alphanumeric input device 412 (e.g., a keyboard), and a user interface (UI) navigation device 414 (e.g., a mouse). In an example, the display unit 410, input device 412 and UI navigation device 414 may be a touch screen display. The machine 400 may additionally include a storage device (e.g., drive unit) 416, a signal generation device 418 (e.g., a speaker), a network interface device 420, and one or more sensors 421, such as a global positioning system (GPS) sensor, compass, accelerometer, or other sensor. The machine 400 may include an output controller 428, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). In certain examples, any one or more of the display unit 410, storage device 416, network interface device or combination thereof can include a multiple device PCIe card.

The storage device 416 may include a machine readable medium 422 on which is stored one or more sets of data structures or instructions 424 (e.g., software) embodying or utilized by any one or more of the techniques or functions described herein. The instructions 424 may also reside, completely or at least partially, within the main memory 404, within static memory 406, or within the hardware processor 402 during execution thereof by the machine 400. In an example, one or any combination of the hardware processor 402, the main memory 404, the static memory 406, or the storage device 416 may constitute machine readable media.

While the machine readable medium 422 is illustrated as a single medium, the term "machine readable medium" may include a single medium or multiple media (e.g., a centralized or distributed database, and/or associated caches and servers) configured to store the one or more instructions 424.

The term "machine readable medium" may include any medium that is capable of storing, encoding, or carrying instructions for execution by the machine 400 and that cause the machine 400 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 424 may further be transmitted or received over a communications network 426 using a transmission medium via the network interface device 420 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 420 may include one or more physical jacks (e.g., Ethernet, coaxial, or phone jacks) or one or more antennas to connect to the communications network 426. In an example, the network interface device 420 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 400, and includes digital or analog communications signals or other intangible medium to facilitate communication of such software.

Figure 5:
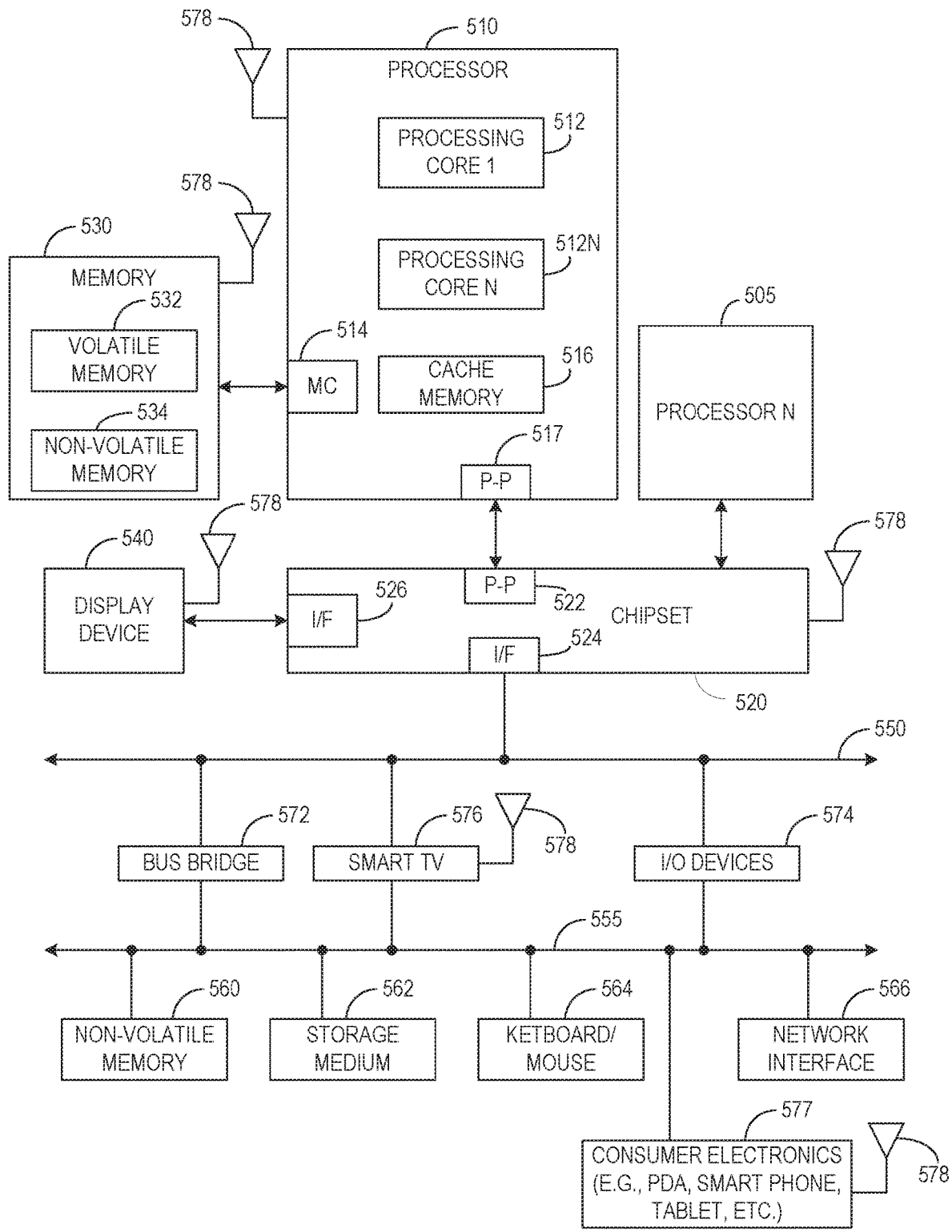
FIG. 5 illustrates a system level diagram, depicting an example of an electronic device (e.g., system) that can employ serial communication improvements as described in the present disclosure.

FIG. 5 illustrates a system level diagram, depicting an example of an electronic device (e.g., system) that can include an inductor formed at a second level interface. FIG. 5 is included to show an example of a higher level device application that can use serial interfaces, such as those discussed above, exchange data between the illustrated components. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, an interface for wireless antenna 578 operates in accordance with, but is not limited to, the IEEE 802.11 standard and its related family, Home Plug AV (HPAV), Ultra Wide Band (UWB) Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522, Chipset 520 enables processor 510 to connect to other elements in system 500. In some embodiments of the example system, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices, including a bus bridge 572, a smart TV 576, I/O devices 574, nonvolatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 may be interconnected together via a bus bridge 572.

In one embodiment, mass storage device 562 includes, but is not limited to, a solid-state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UVB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

Additional Notes

In a first example, Example 1, an apparatus can include a first circuit package having first plurality of external terminations, a second circuit package having a second plurality of external terminations, a plurality of connectors coupling the first plurality of external terminations to the second plurality of external terminations; and an inductor winding comprising the plurality of connectors.

In Example 2, the first circuit package of Example 1 optionally includes a semiconductor substrate having the first plurality of external terminations.

In Example 3, the second circuit package of any one or more of Examples 1-2 optionally include a non-semiconductor interposer.

In Example 4, the apparatus of any one or more of Examples 1-3 optionally includes a magnetic material disposed within the inductor winding and disposed between the first circuit package and the second circuit package.

In Example 5, the plurality of connectors of any one or more of Examples 1-4 optionally is arranged in two groups and the magnetic material is disposed between the two groups of connectors.

In Example 6, the first circuit package of any one or more of Examples 1-5 optionally includes an integrated circuit (IC) package, the second circuit package optionally includes a printed circuit board, and the magnetic material optionally is mechanically coupled to a surface of the integrated circuit package, the surface directly adjacent the printed circuit board.

In Example 7, the first circuit package of any one or more of Examples 1-6 optionally includes an integrated circuit (IC) package, the second circuit package optionally includes a printed circuit board, and the magnetic material optionally is mechanically coupled to a surface of the printed circuit board, the surface directly adjacent the integrated circuit package.

In Example 8, an inductor can include a winding, and a core disposed inside the winding. The winding can include first conductive traces integrated with a substrate of an integrated circuit package, second conductive traces of a printed circuit board, a plurality of connectors configured to connect the substrate with the printed circuit board, and wherein each connector of the plurality of connecters is disposed between a trace of the first conductive traces and a corresponding trace of the second conductive traces.

In Example 9, the plurality of connectors of any one or more of Examples 1-8 optionally include a pin.

In Example 10, the plurality of connectors of any one or more of Examples 1-9 optionally include solder balls.

In Example 11, the core of any one or more of Examples 1-10 optionally includes a magnetic material disposed within the winding and disposed between the integrated circuit package and the printed circuit board.

In Example 12, the plurality of connectors of any one or more of Examples 1-11 optionally is arranged in two groups and the magnetic material is disposed between the two groups of connectors.

In Example 13, the magnetic material of any one or more of Examples 1-12 optionally is mechanically coupled to a surface of the integrated circuit package, the surface directly adjacent the printed circuit board.

In Example 14, the magnetic material of any one or more of Examples 1-13 optionally is mechanically coupled to a surface of the printed circuit board, the surface directly adjacent the integrated circuit package.

In Example 15, a method can include fabricating a first portion of an inductor coil at a substrate of integrated circuit package, fabricating a second portion of the inductor coil in a printed circuit board, and electrically and mechanically coupling the integrate circuit package and the first portion of the inductor coil with the printed circuit board and the second portion of the inductor coil.

In Example 16, fabricating the first portion of the inductor coil of any one or more of Examples 1-15 optionally includes coupling a trace of the substrate forming a first portion of a first winding coil to first and second external terminations of the printed circuit board, the trace configured to form a first portion of a first complete winding of the inductor coil.

In Example 17, the method of any one or more of Examples 1-16 optionally includes depositing a magnetic material to the substrate between the first and second external terminations of the printed circuit board.

In Example 18, the fabricating the second portion of the inductor coil of any one or more of Examples 1-17 optionally includes coupling a trace of the printed circuit board to first and second external terminations of the printed circuit board.

In Example 19, the method of any one or more of Examples 1-18 optionally includes depositing a magnetic material to a surface of the printed circuit board between the first and second external terminations of the printed circuit board.

In Example 20, the electrically and mechanically coupling the integrate circuit package and the first portion of inductor coil with the printed circuit board and the second portion of inductor coil of any one or more of Examples 1-18 optionally includes mechanically and electrically coupling a trace of the first portion of the inductor coil with a trace of the second portion of the inductor coil using a solder ball connector.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed. Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. An apparatus comprising:
a first circuit package having first plurality of external terminations;
a second circuit package having a second plurality of external terminations;
a plurality of connectors coupling the first plurality of external terminations to the second plurality of external terminations;

an inductor winding comprising the plurality of connectors;
a magnetic material disposed within the inductor winding and disposed between the first circuit package and the second circuit package;
wherein the first circuit package includes an integrated circuit (IC) package;
wherein the second circuit package includes a printed circuit board; and
wherein magnetic material is mechanically coupled to a surface of the integrated circuit package, the surface directly adjacent the printed circuit board.

2. The apparatus of claim 1, wherein the first circuit package includes a semiconductor substrate having the first plurality of external terminations.

3. The apparatus of claim 1, wherein the second circuit package include a non-semiconductor interposer.

4. The apparatus of claim 1, wherein the plurality of connectors is arranged in two groups and the magnetic material is disposed between the two groups of connectors.

5. An inductor comprising:
a winding; and
a core disposed inside the winding;
wherein the winding includes:
first conductive traces integrated with a substrate of an integrated circuit package;
second conductive traces of a printed circuit board;
a plurality of connectors configured to connect the substrate with the printed circuit board;
wherein each connector of the plurality of connectors is disposed between a trace of the first conductive traces and a corresponding trace of the second conductive traces;
wherein the core includes a magnetic material disposed within the winding and disposed between the integrated circuit package and the printed circuit board; and
wherein the magnetic material is mechanically coupled to a surface of the integrated circuit package, the surface directly adjacent the printed circuit board.

6. The inductor of claim 5, wherein the plurality of connectors include a pin.

7. The inductor of claim 6, wherein the plurality of connectors include solder balls.

8. The inductor of claim 5, wherein the plurality of connectors is arranged in two groups and the magnetic material is disposed between the two groups of connectors.

9. An apparatus comprising:
a first circuit package having first plurality of external terminations;
a second circuit package having a second plurality of external terminations;
a plurality of connectors coupling the first plurality of external terminations to the second plurality of external terminations;
an inductor winding comprising the plurality of connectors;
a magnetic material disposed within the inductor winding and disposed between the first circuit package and the second circuit package;
wherein the first circuit package includes an integrated circuit (IC) package;
wherein the second circuit package includes a printed circuit board; and
wherein the magnetic material is mechanically coupled to a surface of the printed circuit board, the surface directly adjacent the integrated circuit package.

10. The apparatus of claim 9, wherein the first circuit package includes a semiconductor substrate having the first plurality of external terminations.

11. The apparatus of claim 9, wherein the second circuit package include a non-semiconductor interposer.

12. The apparatus of claim 9, wherein the plurality of connectors is arranged in two groups and the magnetic material is disposed between the two groups of connectors.

13. An inductor comprising:
a winding; and
a core disposed inside the winding;
wherein the winding includes:
first conductive traces integrated with a substrate of an integrated circuit package;
second conductive traces of a printed circuit board;
a plurality of connectors configured to connect the substrate with the printed circuit board;
wherein each connector of the plurality of connectors is disposed between a trace of the first conductive traces and a corresponding trace of the second conductive traces;
wherein the core includes a magnetic material disposed within the winding and disposed between the integrated circuit package and the printed circuit board; and
wherein the magnetic material is mechanically coupled to a surface of the printed circuit board, the surface directly adjacent the integrated circuit package.

14. The inductor of claim 13, wherein the plurality of connectors include a pin.

15. The inductor of claim 14, wherein the plurality of connectors include solder balls.

16. The inductor of claim 15, wherein the plurality of connectors is arranged in two groups and the magnetic material is disposed between the two groups of connectors.

* * * * *